United States Patent [19]
Isoda

[11] Patent Number: 5,404,311
[45] Date of Patent: Apr. 4, 1995

[54] METHOD OF OPTIMIZING DELAY TIMES

[75] Inventor: Yutaka Isoda, Kawasaki, Japan

[73] Assignee: Fujitsu Limited, Kawasaki, Japan

[21] Appl. No.: 74,840

[22] Filed: Jun. 15, 1993

[30] Foreign Application Priority Data

Oct. 17, 1991 [JP] Japan .................................. 3-269771

[51] Int. Cl.6 .............................................. G06F 15/60
[52] U.S. Cl. ..................................... 364/490; 364/489; 364/488
[58] Field of Search ................ 364/488, 489, 490, 491, 364/578

[56] References Cited

U.S. PATENT DOCUMENTS

| | | | |
|---|---|---|---|
| 4,263,651 | 4/1981 | Donath et al. | 364/491 |
| 4,827,428 | 5/1989 | Dunlop et al. | 364/491 |
| 5,197,015 | 3/1993 | Hartoog et al. | 364/490 |
| 5,218,551 | 6/1993 | Agrawal et al. | 364/491 |
| 5,237,514 | 8/1993 | Curtin | 364/490 |
| 5,251,147 | 10/1993 | Finnerty | 364/490 |

OTHER PUBLICATIONS

"Analytical Power/Timing Optimization Technique for Digital System" by A. E. Ruehli et al., IEEE 14th DAC, 1977, pp. 142–146.

"Timing Analysis for nMOS VLSI" by N. P. Jouppi, IEEE 20th Design Automation Conference, 1983, pp. 411–418.

"Timing Influenced Layout Design" by M. Burstein et al., IEEE 22nd Design Automation Conf., 1985, pp. 124–130.

Primary Examiner—Vincent N. Trans
Attorney, Agent, or Firm—Nikaido, Marmelstein, Murray & Oram

[57] ABSTRACT

The present invention relates to a delay time optimizing method of optimizing delay times and a method of optimizing delay times in an LSI equipped with latch circuits at its input and output. The method divides a plurality of logic circuits from a combinatorial circuit located among latch circuits for outputting data related to input data in response to clocks, calculates the delay time of a path between each of the latch circuits at end points and each of the latch circuits at starting points, performing the weighting related to the delay time on each of the distinguished logic circuits located between each of the starting points and each of the end points for each path, and calculates a relative index for changing the delay time for each logic circuit.

9 Claims, 9 Drawing Sheets $T_{dgate} = T_{base} + T_{load}$

| END POINT FF<br>START POINT FF | F4 | F5 | F6 |
|---|---|---|---|
| F1 | 1.3 | 0.8 | 1.7 (RATIO OF DELAY TIME FROM F1 TO F6 TO DESIRED DELAY TIME T (BACK TRACE FROM F6 TO F1)) |
| F2 | 0.9 | 1.5 | 0.6 |
| F3 | 1.1 | 0.7 | 1.4 |

Fig.7

DELAY TIMES (INITIAL VALUES)

| END POINT FF / START POINT FF | F4 | F5 | F6 |
|---|---|---|---|
| F1 | 1.4 | 1.5 | 1.6 |
| F2 | 1.3 | 1.4 | 1.5 |
| F3 | 0.7 | 0.8 | 1.4 |

Fig.8

DELAY TIMES (FIRST RESULT)

| END POINT FF / START POINT FF | F4 | F5 | F6 |
|---|---|---|---|
| F1 | 0.97 | 1.24 | 1.26 |
| F2 | 0.87 | 1.34 | 1.16 |
| F3 | 0.61 | 0.88 | 1.14 |

Fig.9

DELAY TIMES (SECOND RESULT)

| END POINT FF<br><br>START POINT FF | F4 | F5 | F6 |
|---|---|---|---|
| F1 | 1.18 | 1.00 | 1.15 |
| F2 | 1.08 | 0.90 | 1.05 |
| F3 | 0.91 | 0.73 | 1.05 |

Fig.10

UNIT : ns

|  | INITIAL STAGE | FIRST IMPROVEMENTS | SECOND IMPROVEMENTS |
|---|---|---|---|
| L1 | 3.0 | 3.0 | 3.0 |
| L2 | 2.0 | 2.0 | 2.0 |
| L3 | 1.0 | 1.79 | 2.03 |
| L4 | 5.0 | 2.38 | 2.38 |
| L5 | 4.0 | 4.0 | 4.0 |
| L6 | 4.0 | 4.0 | 4.0 |
| L7 | 6.0 | 4.29 | 7.03 |
| L8 | 7.0 | 7.0 | 5.22 |
| L9 | 9.0 | 5.63 | 4.47 |

Fig.11

METHOD OF OPTIMIZING DELAY TIMES

TECHNICAL FIELD

The present invention relates to a design system for an LSI and, more specifically, to a method of optimizing delay times in an LSI having latch circuits at its input and output.

BACKGROUND ART

Many of devices using semiconductor IC logic circuits employ synchronous circuits rather than asynchronous circuits because the former are more reliable.

In the asynchronous system, when, for example, decoding counter outputs, if a time difference occurs between output bits as in a ripple counter, one-shot-like noise, which is referred to as "glitch", will occur each time a counter transition occurs. In the asynchronous system, therefore, delay times are obtained and timing is taken so as not to produce the glitches.

In the synchronous system, in response to successive input clocks, data is read into a latch circuit and then output to the following latch circuit via a target logic gate. This operation is performed sequentially. That is, in the synchronous system, data is entered in sequence to be operated upon and then data is entered again. Since such data entry is performed using the same clock, such a glitch as described above will not be produced. According to the synchronous system, processes such as logical operations, etc., can be performed dependably by merely making sure that the delay time associated with a logic gate located between latch circuits, is within the period of the clock input to the latch circuits.

In order to increase the reliability of operation, therefore, the synchronous system is used more frequently than the asynchronous system.

The performance of devices using the above-described synchronous system depends on the frequency of a clock signal synchronizing the devices, that is, the operating frequency. The operating frequency depends upon a delay time associated with a combinatorial circuit interposed between two latches or flip-flops formed within a semiconductor.

The shorter the above-described delay time, the higher the repetition frequency of the clock signal and the device's performance can be made. However, a plurality of logic circuits exist within an LSI and have different delay times. The maximum delay time will determine the repetition frequency of the clock signal. Thus, when one logic circuit is slow no matter how fast the other logic circuits are, the frequency of the clock signal has to be low, which causes a problem that the overall performance of the device is degraded. That is, in order to for the device to show its performance fully, it is necessary that combinatorial circuits have the same delay time and be fast.

DISCLOSURE OF INVENTION

The present invention provides a delay time optimizing system for optimizing the delay times of logic circuits included in all combinatorial circuits located among latch circuits.

The present invention basically comprises four steps.

The first step is to distinguish logic circuits that are not directly dependent on two or more signals from combinatorial circuits which are latch circuits adapted to input and output data related to input data in response to clocks.

Since the distinguished logic circuits are not directly dependent on two or more signals, the first step permits inverters or buffers provided at the input or the output of each latch circuit and further between logic gates that are directly dependent on two or more signals, for example, multi-input gates. That is, the circuit is separated into latch circuits, multi-input gate, and logic circuits such as inverters and buffers. The logic circuits need not be limited to inverters and buffers but may be adders, shifters and control circuits which perform a series of operations. With such circuits, a path is uniquely determined and the path is then handled as a logic circuit.

The second step is to calculate the delay time of each of the paths between latch circuits serving as end points and latch circuits serving as start points. This calculation is to accumulate the delay times of logic circuits and multi-input gates on each path which have been obtained in advance.

The third step is to perform weighting related to the delay time on the distinguished logic circuits located among the starting point latch circuits and the end point latch circuits for each path.

The weighting is performed on the delay time of each path extending from a starting point latch to an end point latch circuit. For example, attention is paid to the end point latch circuits in sequence. Logic circuits that are common to paths which, of paths extending from the starting point latch circuits to an end point latch circuit, are slow in comparison with a desired value. Weights are specified so as to shorten the delay times of the shared logic circuits. Also, logic circuits that are common to paths which are faster than the desired value are obtained, and such weights as lengthen their delay times are then specified.

The fourth step is to calculate the weight obtained by the third step for each logic circuit to obtain a relative index for the logic circuit.

By performing those steps in sequence, the relative index for each of the distinguished logic circuits can be obtained.

The relative index is, for example, data on an indication of the size of transistors constructing logic gates. The transistor size is changed on the basis of its relative index, and then the second to third steps are repeated again. This repetition permits an optimum logic gate configuration which optimizes the delay times and realizes high performance to be obtained.

BRIEF DESCRIPTION OF DRAWINGS

FIG. 7 is a diagram illustrating delay times;

FIG. 8 is a diagram illustrating delay time ratios between calculated values and desired values (initial values);

FIG. 9 is a diagram illustrating delay time ratios (the first results);

FIG. 10 is a diagram illustrating delay time ratios (the second results);

FIG. 11 is a diagram illustrating variations in the delay time of each logic circuit step by step.

BEST MODE OF CARRYING OUT OF THE INVENTION

Reference will now be made to the accompanying drawings so as to describe the present invention in more detail.

Figure 1:
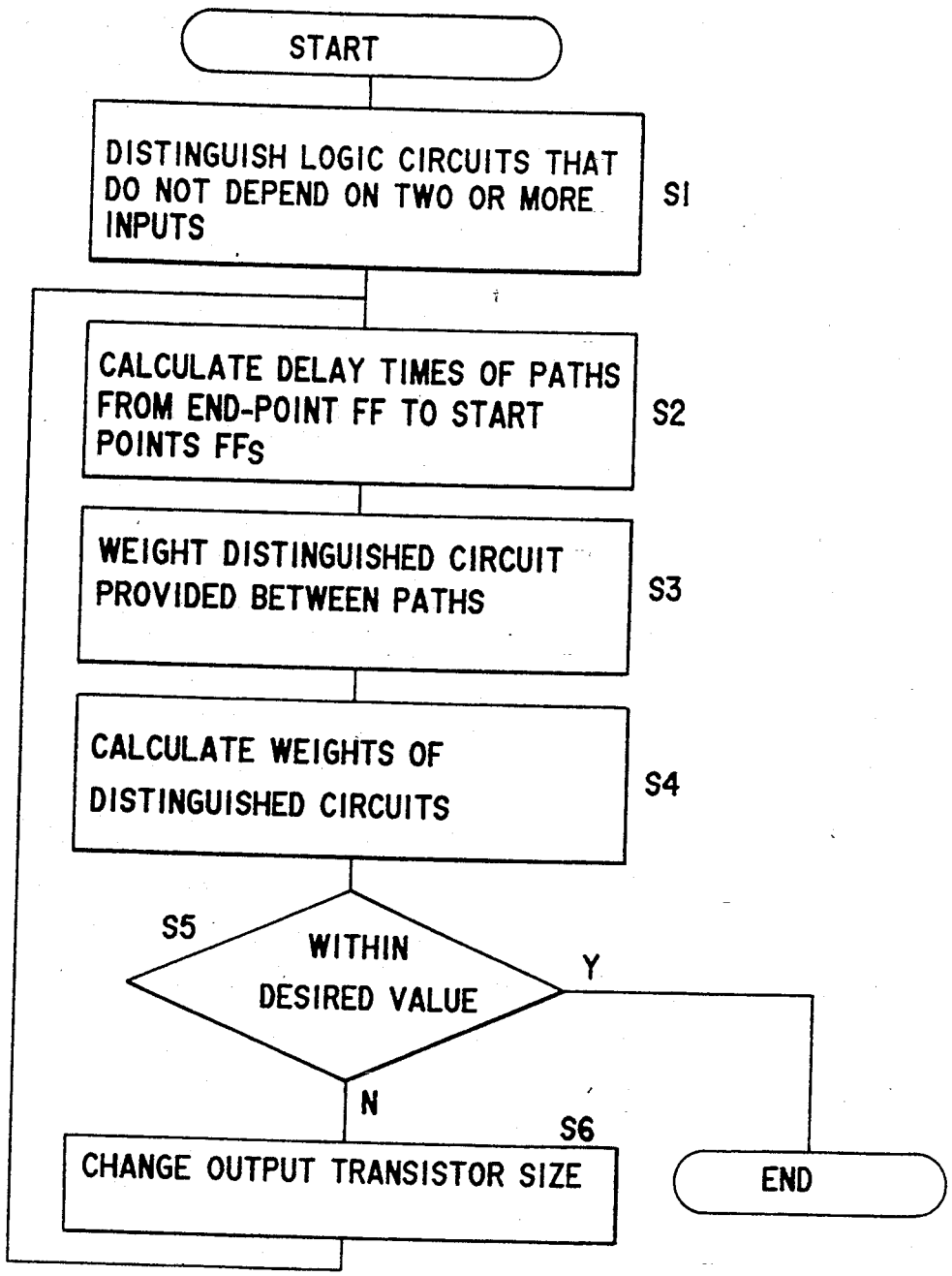
FIG. 1 is a flowchart illustrating an optimization method according to an embodiment of the present invention.

FIG. 1 is a flowchart of an optimization process according to an embodiment of the present invention. When a desired synchronous IC circuit has been designed, the procedure shown in FIG. 1 is carried out. First, in step S1, all of combinatorial circuits located between a latch circuit of interest, serving as an end point, and all of latch circuits serving as starting points are obtained and then two-or-more-input independent logic circuits are distinguished from the combinatorial circuits thus obtained.

In step S1 are distinguished, firstly, logic circuits which do not depend directly on signals from two or more starting-point latch circuits and, secondly, logic circuits which do not depend directly on two or more signals from gates constituting logic using the signals from the latch circuits.

This process is for determining on which paths logic circuits are located whose delay times are to be changed when changing delay times. Where the logic circuits are directly dependent on two or more signals, a single path is uniquely determined by an operator, thereby making them logic circuits which are not directly dependent on two or more signals.

The logic circuits obtained in step S1 are, for example, inverters or buffer circuits. Each of the logic circuits distinguished from multi-input gate circuits has one input and one output. If, therefore, any one of the elements associated with delay times is changed, the delay time can be changed without affecting others. For example, the delay time can be changed by changing the size of the output transistor. It is for this reason that the logic circuit are distinguished.

In step S2 following step S1, the delay times of paths extending from all the start-point latch circuits (FF) to an end-point latch circuit are calculated.

Figure 2:
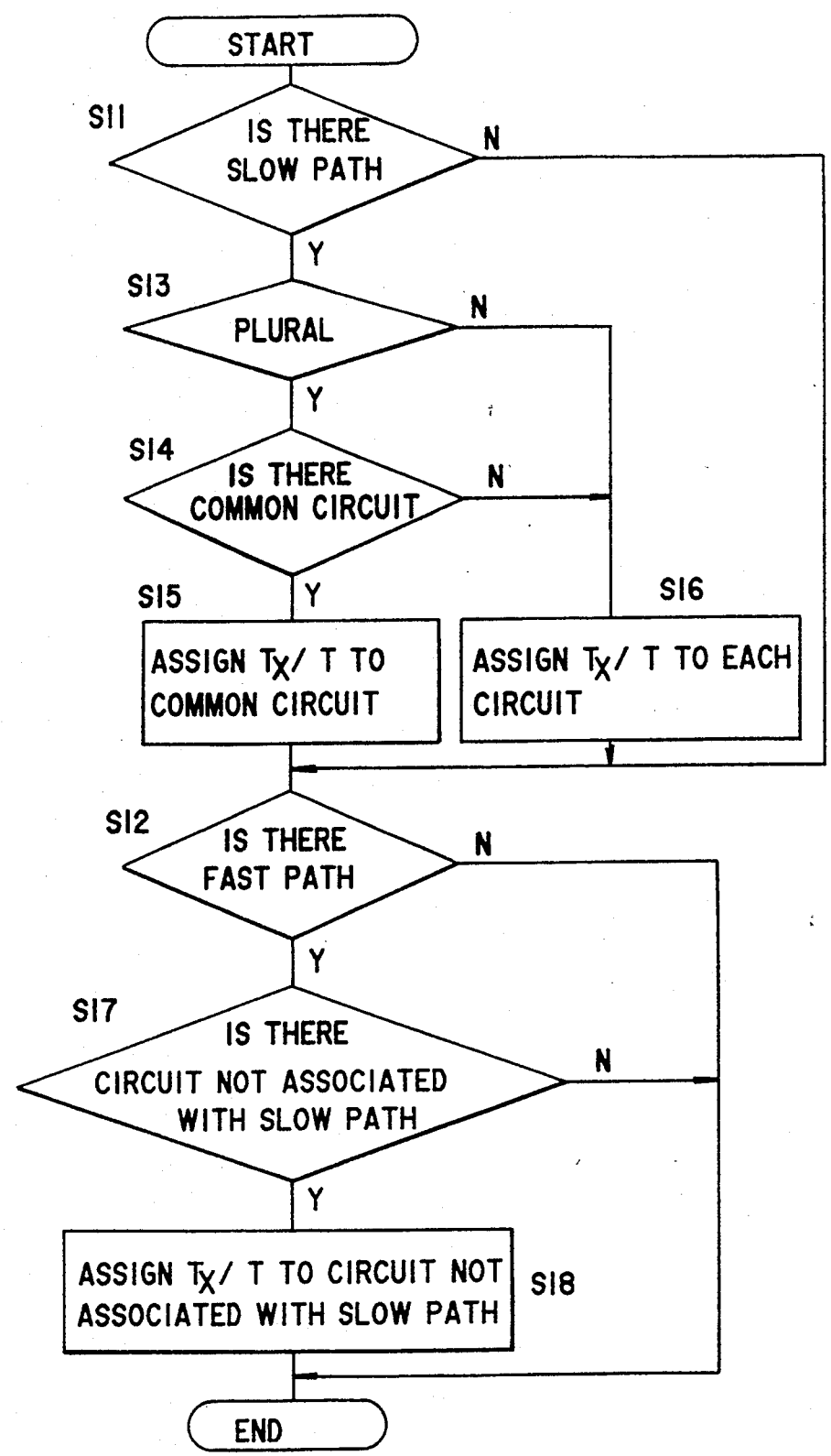
FIG. 2 is a flowchart of the weighting process.

In the subsequent step S3, the weighting of the logic circuits located between the end-point latch circuit and the starting-point latch circuits. The weighting, which will be described later in conjunction with FIG. 2, is performed to determine an index required of each of the logic circuits, depending on whether they are faster or slower than a multiple of standard delay T equal to a time period of 1/F where F is the clock frequency and whether or not there are shared logic circuits among them.

After the weighting process in step S3, a weight of each of the distinguished circuits is calculated in step S4. This is multiplication for distinguished indexes.

A decision is made in step S5 as to whether or not all the calculated values for weights are within a desired value. When the calculated values are all within the desired value (Y), the process terminates.

If, on the other hand, all the calculated values are not within the desired value (N), then the areas of output transistors are changed in step S6. That is, the size of an output transistor in a logic circuit needing improvement is multiplied by a corresponding calculated value obtained in step S4.

At the time when the output transistors have their sizes changed in step S6, the delay times of the paths extending from the end-point latch circuit to all the latch circuits are calculated again. By performing steps S2, S3 and S4 in sequence, the calculated values serving as desired improvement indexes will be obtained and will eventually fall within the desired value in decision step S5, terminating the process. At this point, the desired LSI component values can be set.

That is, if the weighting index of each logic circuit thus obtained is unity or below, then it is decided that the desired values have been reached, terminating the process. If, however, the weighting index is above unity, then the output transistor of each logic circuit is changed again in accordance with its weighting index. This process is repeated in sequence. As a result, at the time when the weighting index becomes unity, it is decided that the goal has been reached, terminating the process and determining set values for a fast LSI.

With CMOS logic circuits, when the size of a transistor, its width in particular, is increased, its driving capability can be enhanced, permitting fast operation. Conversely, when the size of a transistor is decreased, its driving capability is lowered, providing slower operation.

The present invention utilizes this property to make the size of the output transistors larger in logic circuits which have a large delay time, and the size of the output transistors smaller in logic circuits having margins for delay times to thereby make the layout area small.

Thereby, the speed of logic circuits which are critical in delay time is increased, the size of logic circuits which are not critical in delay time is decreased, and indexes for designing an optimum LSI are obtained. Note that transistors whose sizes are changed may be transistors at intermediate and input stages as well as transistors at output stages.

FIG. 2 is a flowchart of the weighting process in step S3. When the execution of the process of step S3 is started, a decision is made in step S11 as to whether or not there is a slow path among paths.

If there is no slow path (N), then step S12 which will be described later is executed. If, on the other hand, there is a slow path (Y), then a decision is made in step S13 as to whether or not the slow path comprises a plurality of logic circuits.

If the result of the decision in step S13 indicates that the slow path comprises a plurality of logic circuits (Y), then a decision is made in subsequent step S14 as to whether or not there is a plurality of common circuits. If there are common circuits (Y), they are considered to be slow and thus the weighting index thereof is made TX/T where TX is a delay time obtained by calculations and T is a desired delay time.

When, in step S14, it is decided that there is no common circuit (N) or when it is decided in step S13 that there are not a plurality of logic circuits (N), the weighting index of each of the relevant logic circuits is made TX/T in step S16.

In step S15, only the common circuits are assigned TX/T. In step S16, however, if there is a plurality of logic circuits, each logic circuit is assigned TX/T, and if there is one single logic circuit, it is assigned TX/T.

By the above processing, the processing when a slow path exists terminates. Subsequently, in step S12, a decision is made as to whether or not there is a fast path. If there is no fast path (N), all the processing terminates.

If there is a fast path (Y), a decision is made in step S17 as to whether or not a logic circuit that is not associated with a slow path exists on the fast path. If there is no such logic circuit (N), the processing terminates.

In steps S15, S16, the processing when a slow path exists is performed. When there is a slow path, a desired circuit can never be obtained without performing such processing. In contrast, even if a fast path exists, when a logic circuit which constitutes the fast path also constitutes the above slow path, it cannot be made slow. For this reason, the delay time of a logic circuit which constitutes a fast path and which is not included in a slow path is made slow by processing to be described later.

When there is a circuit which is not associated with a slow path (Y), the path of the logic circuit is made TX/T in step S18. Since the logic circuit which is not associated with a slow path exists on a fast path, the TX/T value is set to 1 or below. After the execution of step S18 all the processing terminates.

By the processing for weighting indexes each logic circuit is assigned a weighting index. Any logic circuit which has not been assigned a weighting index in steps S15, S16 and S18 is assigned 1 as the default value.

The common circuits refer to logic circuits Ln which contribute in common to a plurality of paths having delay values when tracing back is performed from the single end-point latch circuit to the plurality of starting-point latch circuits. Since each logic circuit (logic block) is normally specified as a common circuit, common circuits can be recognized and identified by a computer. Similarly, for a fast path as well, it is necessary only to identify logic circuits that are not at all associated with any slow path.

Figure 3:
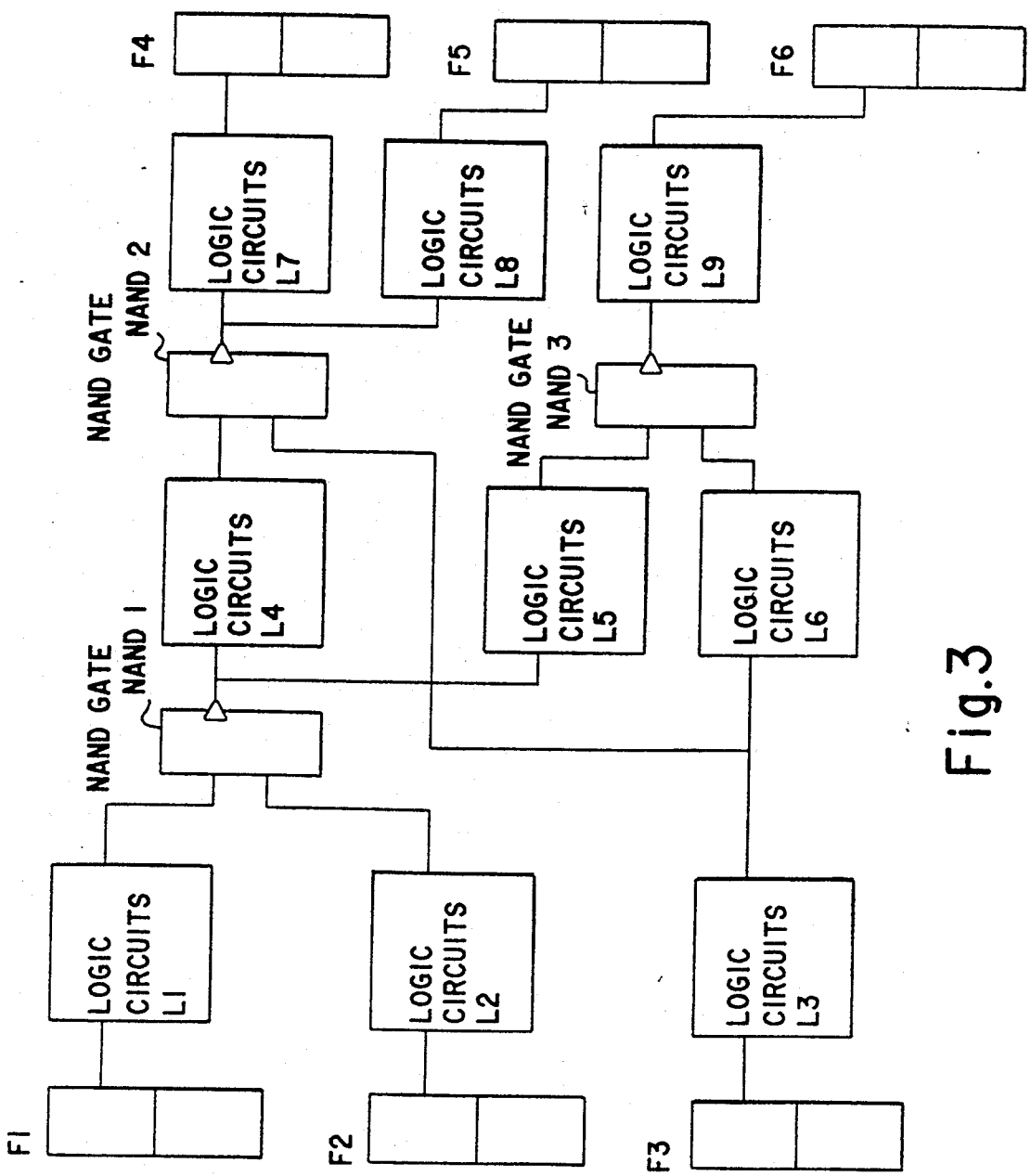
FIG. 3 is a block diagram of a model.
Figure 4:
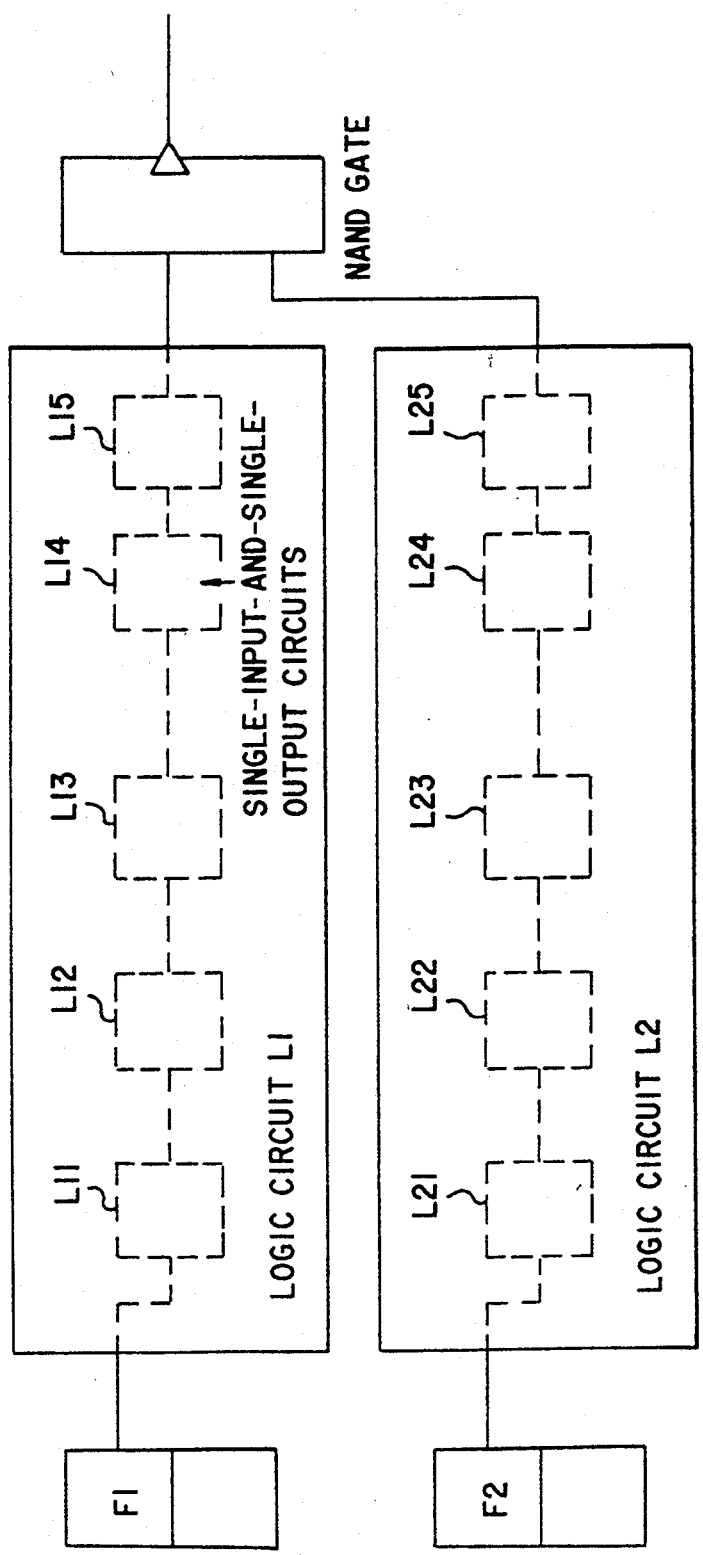
FIG. 4 shows logic circuits in block diagram form.

It is assumed that circuits included in each of logic circuits L1 through L9 in a model block diagram of FIG. 3 are each constructed from a single-input circuit. For example, as shown in FIG. 4, the logic circuits L1 and L2 are constructed from single-input-and-single-output circuits L11 through L15 and L21 through L25, respectively. However, the present invention is not limited to such a configuration.

Hereinafter, another model configuration will be described. In actual LSI design, a designer indicates a group of some logic as a logical block and specifies flip-flops and latch circuits of interest, too. In many cases, logical blocks are distinguished into a functional block. For example, logical blocks are distinguished into functions such as adders, shifters, arithmetic units, control circuits, etc. These logical blocks are not constructed from one-input one-output logic circuits.

Figure 5:
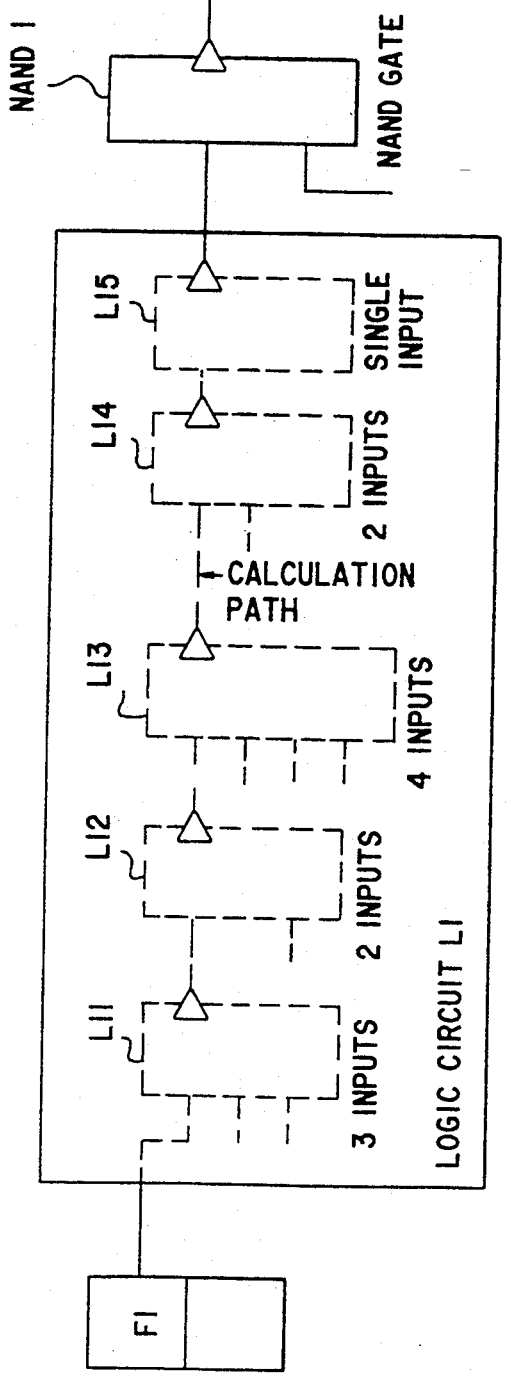
FIG. 5 shows a logic diagram in block diagram form.

A single path within logical blocks is determined uniquely and the above-described processing is performed on the assumption that the path is assumed to be a one-input one-output circuit. For example, as shown in FIG. 5, even if each of the logic circuits is a plural-input gate like a logic circuit L11 is a three-input gate, a logic circuit L12 is a two-input gate, a logic circuit L13 is a four-input gate, a logic circuit L14 is a two-input gate and a logic circuit L15 is a one-input gate, one of the inputs determines as a calculation path PS and assumed to be a one-input one-output logic circuit.

Figure 6:
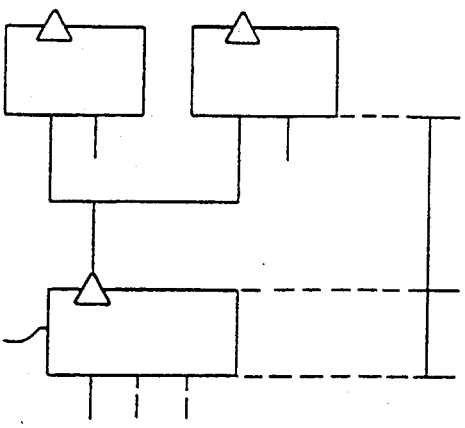
FIG. 6 is a diagram for use in explanation of a delay time of logic circuit.

On the other hand, the delay time (Tdgate) of each of logic gates within the logic circuits L1 through L9 is obtained in advance. Usually, the delay time TLn of one logic gate is calculated, as shown in FIG. 6, to be the sum (Tbase+Tload) of the basic delay value (Tbase) of that gate and the delay value (Tload) of its output loads (the number (Fan-Out) of load gates and wiring for connecting them).

The path delay value between latch circuits and the delay value of each logic circuit Ln are each an accumulation of those gate delay values and can be calculated by the use of a computer.

Hereinafter, further detailed description will be made using an actual example.

FIG. 3 illustrates a model configuration for explaining the logic of the invention.

Latch circuits F1 to F3 composed of flip-flops are latch circuits for starting points. Likewise, latch circuits F4 to F6 are latch circuits for end points. In this model configuration, nine logic circuits L1 through L9 are distinguished from the circuit sandwiched by the starting-point latch circuits F1 to F3 and the end-point latch circuits F4 and F6. These logic circuits L1 through L9 are combinatorial circuits not having sequential circuits, such as latch circuits, therein and do not depend on two or more signals. The others are NAND gates.

That is, the model has the following connection configuration. The logic circuits L1 to L3 are connected to the starting-point latches F1 to F3. The outputs of the logic circuits L1 and L2 are input to the NAND gate NAND1 whose output is input to the logic circuits L4 and L5. The output of the logic circuits L4 is applied to the input of the NAND gate NAND2 whose output is applied to the end-point latch circuits F4 and F5 via the logic circuits L7 and L8.

Further, the output of the logic circuit L3 is connected to the logic circuit L6. The outputs of the logic circuits L5 and L6 are input to the NAND gate NAND3 whose output is applied to the end-point latch circuit F6 via the NAND gate NAND3.

It is in step S1 in FIG. 2 that the logic circuits are distinguished from the combinatorial circuits.

The delay time of each of the logic gates, that is, the logic circuits L1 to L9 and the NAND gates NAND1 to NAND3, when constructed from transistors having standard size is calculated. The ratio of the delay time from each end-point latch circuit to each starting point latch circuit to the desired delay time T is calculated and then the delay time table shown in FIG. 7 is created. The delay times in FIG. 7 represent values obtained by dividing the calculated delay times by the desired delay time T, i.e., normalized values. The table of FIG. 7 is obtained in step S2 (the first processing) of FIG. 1.

Subsequently, logic circuits Ln needing an improvement in common and improvement indexes, i.e., weighting indexes, are calculated from the delay time table of FIG. 7 and the model configuration diagram in the following sequence. The procedure of obtaining the improvement indexes, i.e., weighting indexes, is performed by the processing of FIG. 2 which represents step S3 in detail.

For the path to the end-point latch circuit F4, the delay times of the path from the latch circuit F1, the path from the latch circuit F2, and the path from the latch circuit F3 are obtained. The delay times are 1.3, 0.9, and 1.1, respectively. The paths from the latch circuits F1 and F3 are slow in comparison with the desired value. A logic circuit or logic circuits through which the paths from the latch F1 to the latch circuit F4 and from the latch F3 to the latch circuit F4 pass in common are obtained.

It is the logic circuit L7 that the paths pass through in common. Thus, the logic circuit L7 is considered to need speeding-up and its improvement index is then set to a maximum value of 1.3 for L7. This improvement index indicates that the transistor size should be increased by a factor of 1.3 for L7. The transistor size is finally determined by the weighting index obtained from the improvement index.

The path from the latch circuit F2 is so fast as to have an improvement index of 0.9 for L2. It is the logic circuit L2 that is included in that path and not associated with a slow path. From this it follows that the speed of the logic circuit L2 may be decreased. Thus, its improvement index is set to 0.9. That is, the transistor size is changed by a factor 0.9.

Subsequently the path to the end-point latch circuit F5 will be considered. The path from the latch circuit F2 is so slow as to be 1.5. It is the logic circuits L2, L4 and L8 that pass through that path in common. They need to be speeded up. Thus, their respective improvement indexes are set to a maximum value of 1.5 for L2, L4 and L8.

The path from the latch circuit F1 and the path from the latch circuit F3 are both fast. Thus, it is the logic circuits L1 and L3 that are not associated with the slow path. It follows that the logic circuits L1 and L3 can be slowed down. Thus, their improvement indexes are set to 0.8 for L1 and 0.7 for L3, respectively.

Further, in the path of the end-point latch circuit F6, the path from the latch circuit F1 is as slow as 1.7 for L9 and the relative delay time of the path from the latch circuit F3 is as slow as 1.4. It is the logic circuit L9 that is common to the paths. Thus, the logic circuit L9 needs to be speeded up. The improvement index at this point is set to a maximum value of 1.7 for L9.

The delay time of the path from the latch circuit F2 is as fast as 0.6 for L2. Thus, it is the logic circuit L2 that is not associated with the slow paths. It follows that the logic circuit L2 can be slowed down. The improvement index at this point is set to 0.6 for L2.

As described above, the weights, or the improvement indexes of the logic circuits are obtained for each path. Subsequently the improvement index of each logic circuit is calculated. The calculations are performed in step S4 in FIG. 4. The improvement indexes are:

KL1=1.0×0.8=0.8 times
KL2=1.0×0.9×1.5×0.6=0.81 times
KL3=1.0×0.7=0.7 times
KL4=1.0×1.5=1.5 times
KL5=1.0=1.0 time
KL6=1.0=1.0 time
KL7=1.0×1.3=1.3 times
KL8=1.0×1.5=1.5 *times*
L9=1.0×1.7=1.7 times KL1 to KL9 are calculated improvement indexes of the logic circuits L1 to L9.

The above improvements permit a substantially desired LSI to be attained. However, since the logic is not perfect, the transistor size is changed and the delay times are calculated again as in the steps following step S5 in FIG. 5.

The ratio relative to the desired delay time T is calculated again for further improvements.

The repetition as described above permits an LSI meeting the desired delay time T to be obtained designed values.

Further, the process of keeping the delay time within the desired delay time by repeating the above-described procedure of obtaining the improvement indexes a number of times will be described in detail using actual numeric values of an IC configured as shown in FIG. 3.

The delay times TL1 to T19 of the logic circuits L1 to L9 are assumed as shown in FIG. 6 as follows:

TL1=3.0 ns
TL2=2.0 ns
TL3=1.0 ns
TL4=5.0 ns
TL5=4.0 ns
TL6=4.0 ns
TL7=6.0 ns
TL8=7.0 ns
TL9=9.0 ns

The desired delay time T is assumed to be T=10.0 ns.

The delay time between latch circuits is an accumulation of the delay times of logic circuits between paths.

The normalized delay time from the latch circuit F1 to the latch circuit F4 is the sum of the delay times TL1, TL4 and TL7 of the logic circuits L1, L4 and L7, that is, 3.0 ns+5.0 ns+6.0 ns=14 ns. This is distinguished by the desired delay time T=10.0 ns for normalization, so that 1.4 results. The normalized delay times from each of the starting-point latch circuits F1, F2 and F3 to the end-point latch circuits F4, F5 and F6 become as follows:

$$\begin{aligned}
F1 \to F4 &= (TL1 + TL4 + TL7)/T \\
&= (3.0 + 5.0 + 6.0)/10.0 = 1.4 \\
F2 \to F4 &= (TL2 + TL4 + TL7)/T \\
&= (2.0 + 5.0 + 6.0)/10.0 = 1.3 \\
F3 \to F4 &= (TL3 + TL7)/T \\
&= (1.0 + 6.0)/10.0 = 0.7 \\
F1 \to F5 &= (TL1 + TL4 + TL8)/T \\
&= (3.0 + 5.0 + 7.0)/10.0 = 1.5 \\
F2 \to F5 &= (TL2 + TL4 + TL8)/T \\
&= (2.0 + 5.0 + 7.0)/10.0 = 1.4 \\
F3 \to F5 &= (TL3 + TL8)/T \\
&= (1.0 + 7.0)/10.0 = 0.8 \\
F1 \to F6 &= (TL1 + TL5 + TL9)/T \\
&= (3.0 + 4.0 + 9.0)/10.0 = 1.6 \\
F2 \to F6 &= (TL2 + TL5 + TL9)/T \\
&= (2.0 + 4.0 + 9.0)/10.0 = 1.5 \\
F3 \to F6 &= (TL3 + TL6 + TL9)/T \\
&= (1.0 + 4.0 + 9.0)/10.0 = 1.4
\end{aligned}$$

From the above results the normalized delay time between each starting-point latch circuit and each end-point latch circuit becomes as shown in FIG. 8.

Subsequently, logic circuits Ln needing improvements in common and improvement indexes, or weighting indexes are calculated from the delay time table of FIG. 8 and the model configuration diagram in the following sequence. The procedure for obtaining the improvement indexes is performed by the process of FIG. 2 and is the same as the above-described application.

The delay times of the path from the latch circuit F1 to the latch circuit F4 and the path from the latch circuit F2 to the latch circuit F4 are 1.4 and 1.3. These are slow in comparison with the desired value. It is the logic circuits L4 and L7 that pass through the path to the end-point latch circuit F4 in common. Thus, the logic circuits L4 and L7 need to be speeded up. The improvement index for the logic circuits L4 and L7 is set to a maximum value of 1.4.

The path from the latch circuit F3 is as fast as 0.7. It is the logic circuit L3 that is included in that path and not associated with any slow path, and it thus follows that the logic circuit L3 can be slowed down. Thus, the improvement index for that logic circuit is set to 0.7.

Subsequently the path extending to the end-point latch circuit F5 will be considered. The paths from the latch circuits F1 and F2 are so slow as 1.5 and 1.4, and it is the logic circuit L4 that passes through the paths in common. The paths need to be speeded up. The improvement index is therefore set to a maximum value of 1.5 for L4.

The path from the latch circuit F3 is fast. Since it is the logic circuit L3 that is not associated with any slow path, it can be slowed down. The improvement index is thus set to 0.8 for L3.

Further, the paths extending from the latch circuits F1, F2, and F3 to the end-point latch circuit F6 are so slow as to be 1.6, 1.5, and 1.4. It is the logic circuit L9 that is common to those paths. The logic circuit L9 needs to be speeded up. The improvement is thus set to a maximum value of 1.6 for L9.

Subsequently, the improvement indexes KL1 to KL9 thus are each calculated for each logic circuit as follows:

KL1 = 1.0 = 1.0 time
KL2 = 1.0 = 1.0 time
KL3 = 1.0 × 0.7 × 0.8 = 0.56 times
KL4 = 1.0 × 1.4 × 1.5 = 2.1 times
KL5 = 1.0 = 1.0 time
KL6 = 1.0 = 1.0 time
KL7 = 1.0 × 1.4 = 1.4 times
KL8 = 1.0 = 1.0 time
KL9 = 1.0 × 1.6 = 1.6 times The improvement indexes KL1 to KL9 are each used to change the size or length of the output transistor, for example, of a corresponding logic circuit.

The transistor size and the delay time are proportional to each other as described above. As a result of the changing of the output transistors, the delay times TL1 to TL9 become as follows:

TL1 = 3.0 ns
TL2 = 2.0 ns
TL3 = 1.0/(0.7 × 0.8) = 1.79 ns
TL4 = 5.0/(1.4 × 1.5) = 2.38 ns
TL5 = 4.0 ns
TL6 = 4.0 ns
TL7 = 6.0/1.4 = 4.29 ns
TL8 = 7.0 ns
TL9 = 9.0/1.6 = 5.63 ns

The delay times TL1 to TL9 of the logic circuits L1 to L9 are used to obtain the delay time of each path. This is the same as the process described in FIG. 8. The delay times of the paths are calculated from the following equations.

```
F1 → F4 = (TL1 + TL4 + TL7)/T
       = (3.0 + 2.38 + 4.29)/10.0 = 0.97
F2 → F4 = (TL2 + TL4 + TL7)/T
       = (2.0 + 2.38 + 4.29)/10.0 = 0.87
F3 → F4 = (TL3 + TL7)/T
       = (1.79 + 4.291)/10.0 = 0.61
F1 → F5 = (TL1 + TL4 + TL8)/T
       = (3.0 + 2.38 + 7.0)/10.0 = 1.24
F2 → F5 = (TL2 + TL4 + TL8)/T
       = (2.0 + 2.38 + 7.0)/10.0 = 1.34
F3 → F5 = (TL3 + TL8)/T
       = (1.79 + 7.0)/10.0 = 0.88
F1 → F6 = (TL3 + TL4 + TL9)/T
       = (3.0 + 4.0 + 5.63)/10.0 = 1.26
F2 → F6 = (TL2 + TL5 + TL9)/T
       = (2.0 + 4.0 + 5.63)/10.0 = 1.16
F3 → F6 = (TL3 + TL6 + TL9)/T
       = (1.79 + 4.0 + 5.63)/10.0 = 1.14
```

Thereby, a new delay circuit (the first result) is obtained as shown in FIG. 9.

Subsequently the second improvement indexes are obtained. The normalized delay times of the paths extending from the latch circuits F1, F2 and F3 to the latch circuit F4 are 0.97, 0.87, and 0.61, respectively. It is the logic circuit L7 that is common to these paths and is not associated with any slow path. Thus, the delay index for that logic circuit is set to 0.61.

The normalized delay times of the paths extending from the latch circuits F1, F2 and F3 to the latch circuit F5 are 1.24, 1.34 and 0.88, respectively. There exist two slow delay paths. It is the logic circuits L4 and L8 that are associated with these paths. The delay index for the delay circuit is set to 1.34. It is the logic circuit L3 that is associated with a fast path but not with any slow path, its delay index being set to 0.88.

The normalized delay times of the paths extending from the latch circuits F1, F2 and F3 to the latch circuit F6 are 1.26, 1.16 and 1.14, respectively, which are all slower than the desired value. It is the logic circuit L9 that is associated with all the paths. Thus, the delay index for the logic circuit L9 is set to a maximum value of 1.26.

The delay times of the logic circuits thus recalculated are:

L1 = 3.0 ns
L2 = 2.0 ns
L3 = 1.79/0.88 = 2.03 ns
L4 = 2.38/1.34 = 1.78 ns
L5 = 4.0 ns
L6 = 4.0 ns
L7 = 4.29/0.61 = 7.03 ns
L8 = 7.0/1.34 = 5.22 ns
L9 = 5.63/1.26 = 4.47 ns

Thus, the normalized delay times among the latch circuits are as follows (refer to FIG. 10):

```
F1 → F4 = (TL1 + TL4 + TL7)/T
       = (3.0 + 1.78 + 7.03)/10.0 = 1.18
F2 → F4 = (TL2 + TL4 + TL7)/T
       = (2.0 + 1.78 + 7.03)/10.0 = 1.08
F3 → F4 = (TL3 + TL7)/T
       = (2.03 + 7.03)/10.0 = 0.91
F1 → F5 = (TL1 + TL4 + TL8)/T
       = (3.0 + 1.78 + 5.22)/10.0 = 1.00
F2 → F5 = (TL2 + TL4 + TL8)/T
       = (2.0 + 1.78 + 5.22)/10.0 = 0.90
F3 → F5 = (TL3 + TL8)/T
       = (2.03 + 5.22)/10.0 = 0.73
F1 → F6 = (TL3 + TL5 + TL9)/T
       = (3.0 + 4.0 + 4.47)/10.0 = 1.15
F2 → F6 = (TL2 + TL5 + TL9)/T
       = (2.0 + 4.0 + 4.47)/10.0 = 1.05
F3 → F6 = (TL3 + TL6 + TL7)/T
       = (2.03 + 4.0 + 4.47)/10.0 = 1.05
```

By modifying each of the logic circuits as shown in the table of FIG. 11 which indicates changes of the delay times of the logic circuits, the path delay times sequentially approach the desired value.

Figure 12:
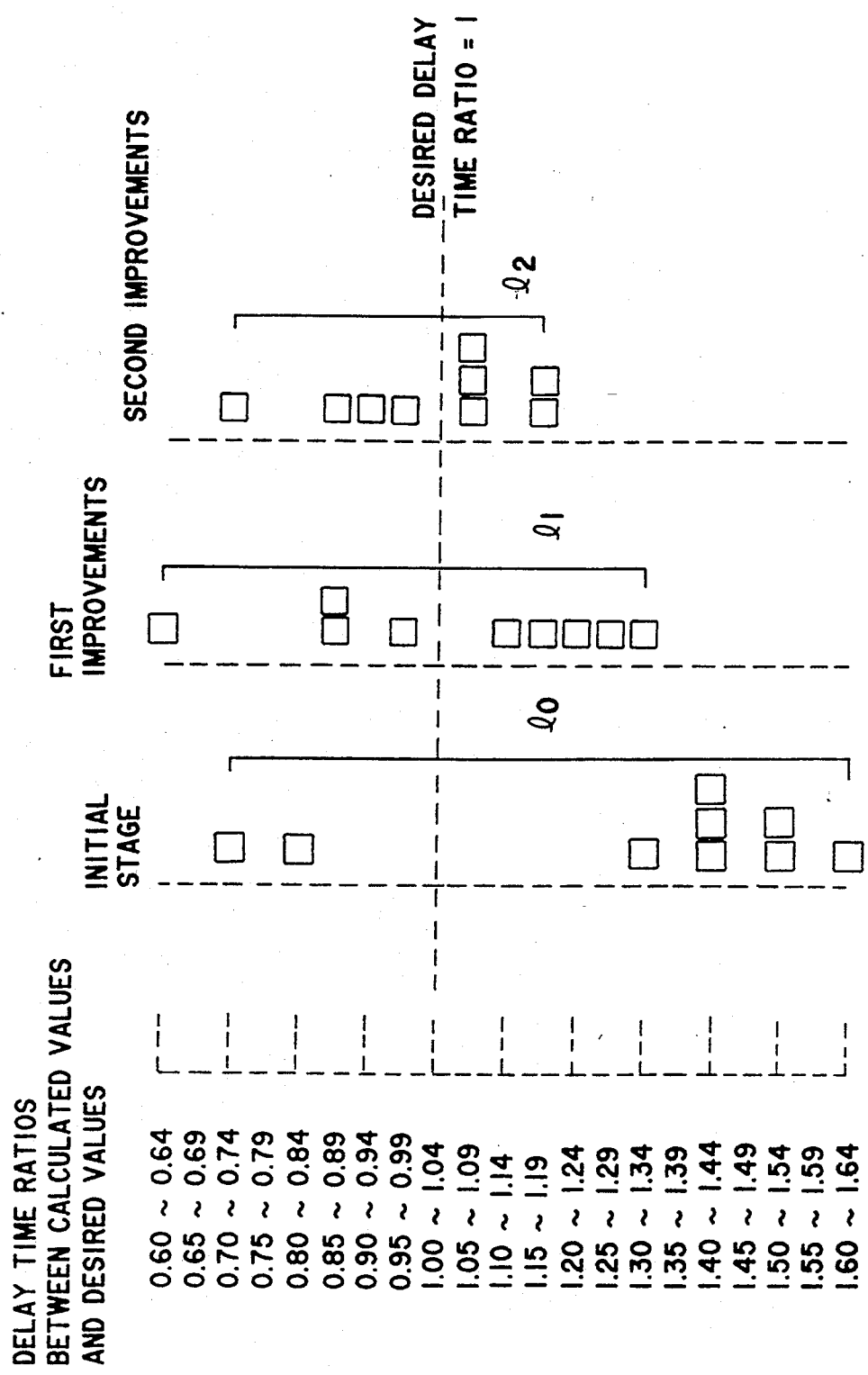
FIG. 12 is a diagram illustrating normalized delay times of each path at the initial stage and after the first and second improving processes.

FIG. 12 is a diagram illustrating the normalized delay times of the paths at the initial stage and after the first and second improvement processes. At the initial stage the maximum normalized delay time is 1.6. The first time the improvement process is performed, it becomes 1.34, and the second time it becomes 1.18. This indicates that the processing according to the embodiment of the present invention makes it possible to speed up a clock signal used in a synchronous IC. A difference in delay time between paths (between the slowest and fastest paths) decreases from $l_0$ to $l_1$ and then from $l_1$ to $l_2$.

The above processing is performed twice but may be performed three times or more.

In the first embodiment, the processing is terminated when all the delay times fall within a desired value. This is not restrictive. A modification may be made in such a way as to obtain a difference in delay time between the fastest and slowest paths constantly and terminate the processing when that difference falls within a specific value. Alternatively, the processing may be terminated when the difference has become unchanged or otherwise becomes great.

INDUSTRIAL APPLICABILITY

The present invention, as described above, allows the delay times of logic circuits and the layout area to be improved with a better balance therebetween and an LSI to be designed so that each logic circuit has the same delay time and a high operating speed, thus providing a highly reliable LSI.

What is claimed is:

1. The method of designing a semiconductor IC circuit composed of at least a combinatorial circuit and a plurality of latch circuits, a method of optimizing delay times characterized by comprising the steps of:
   dividing logic circuits that are not directly dependent on two or more signals from the combinational logic circuit located among the latch circuits for inputting and outputting data in response to a clock;
   determining latch circuits serving as end points and latch circuits serving as start points;
   calculating the delay time of a path of the combinational logic circuit between each of the latch circuits serving as the end points and each of the latch circuits serving as the starting points;
   performing weighting related to the delay time on each of the distinguished combinational logic circuits located between the starting points and the end points for each path; and
   calculating a relative index for changing the delay time from the resultant weighting for each combinational logic circuit.

2. The method of optimizing delay times according to claim 1 wherein the relative index of the combinational logic circuit is data on the size of a transistor constructing the combinational logic circuit.

3. The method of optimizing delay times according to claim 1 wherein the weighting is selective allocation of a value obtained by normalizing the delay time of the combinational logic circuit between the latch circuits by a desired delay time of the semiconductor IC circuit to be designed to provide the combinational logic circuit associated with the path.

4. The method of optimizing delay times according to claim 3 wherein, when normalized values of the delay times of a plurality of paths extending to the same end-point latch are greater than unity, the selective allocation multiplies the relative index of a combinational logic circuit that is common to the paths by the normalized value.

5. The method of optimizing delay times according to claim 3 wherein, when the initial size of the transistor is assumed to be 1, the relative index determines the size of the transistor according to the result obtained by multiplying the initial size value by the normalized value of the delay time.

6. The method of optimizing delay times according to claim 3 wherein, when the normalized value of the delay time of a path to an end-point latch is smaller than 1, the selective allocation multiplies the relative index of a combinational logic circuit associated with that path other than combinational logic circuits associated with other paths whose normalized values are greater than 1 by the normalized value.

7. The method of optimizing delay times according to claim 6 wherein the relative index determines the size of a transistor according to the result obtained by multiplying the initial size of a transistor assumed to be 1 by the normalized value.

8. The method of optimizing delay times according to claim 1 wherein a gate of the combinational logic circuit is improved by the relative index and this process is repeated again to thereby provide more optimum gate.

9. The method of optimizing delay times according to claim 1 wherein the combinational logic circuits that are not directly dependent on two or more signals are one-input combinational logic circuits which uniquely determine the combinational logic circuit having a plurality of inputs.

* * * * *

UNITED STATES PATENT AND TRADEMARK OFFICE
CERTIFICATE OF CORRECTION

PATENT NO. : 5,404,311
DATED : April 4, 1995
INVENTOR(S) : ISODA

It is certified that error appears in the above-indentified patent and that said Letters Patent is hereby corrected as shown below:

On Title page:

Item [22], insert -- PCT Filed October 19, 1992 --

Item [86], insert -- PCT No. PCT/JP92/01354

§ 371 Date: June 15, 1993

§ 102(e) Date: June 15, 1993 --

Item [87], insert -- PCT Pub. No.: WO93/08598

PCT Pub. Date: April 29, 1993 --

Signed and Sealed this

Fifteenth Day of April, 1997

Attest:

BRUCE LEHMAN

*Attesting Officer*                    *Commissioner of Patents and Trademarks*